(12) United States Patent  (10) Patent No.: US 8,395,141 B2
Ahn  (45) Date of Patent: Mar. 12, 2013

(54) COMPOUND SEMICONDUCTORS

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 396 days.

(21) Appl. No.: 12/498,257

(22) Filed: Jul. 6, 2009

(65) Prior Publication Data

US 2011/0001121 A1    Jan. 6, 2011

(51) Int. Cl.
  *H01L 29/06*    (2006.01)
(52) U.S. Cl. .................................. 257/14; 257/E33.019
(58) Field of Classification Search .................... 257/13, 257/14, 18, 20–24, 44, 45, 50, 94, 99, 103, 257/191, 201, 743, 749, E33.005, E33.019
  See application file for complete search history.

(56) References Cited

U.S. PATENT DOCUMENTS

| | | | |
|---|---|---|---|
| 3,920,860 A | | 11/1975 | Freller et al. |
| 3,990,096 A | | 11/1976 | Namizaki et al. |
| 4,764,261 A | | 8/1988 | Ondris et al. |
| 5,079,774 A | * | 1/1992 | Mendez et al. .................. 372/27 |
| 5,112,410 A | | 5/1992 | Chen |
| 5,175,739 A | | 12/1992 | Takeuchi et al. |
| 5,181,219 A | | 1/1993 | Mori et al. |
| 5,181,221 A | | 1/1993 | Mori et al. |
| 5,182,757 A | | 1/1993 | Mori et al. |
| 5,287,377 A | * | 2/1994 | Fukuzawa et al. .......... 372/45.01 |
| 5,291,507 A | * | 3/1994 | Haase et al. ................ 372/44.01 |
| 5,295,148 A | | 3/1994 | Mori et al. |
| 5,317,584 A | | 5/1994 | Mori et al. |
| 5,404,027 A | * | 4/1995 | Haase et al. ..................... 257/13 |
| 5,404,369 A | | 4/1995 | Mori et al. |
| 5,490,953 A | | 2/1996 | Morita |
| 5,563,902 A | * | 10/1996 | Xu et al. .................... 372/50.11 |
| 5,606,176 A | * | 2/1997 | Nitta ............................... 257/18 |
| 5,646,419 A | * | 7/1997 | McCaldin et al. .............. 257/13 |
| 5,818,072 A | * | 10/1998 | Schetzina ....................... 257/78 |

(Continued)

FOREIGN PATENT DOCUMENTS

| | | |
|---|---|---|
| JP | 409199783 | 7/1997 |
| JP | 07202340 | 8/2007 |

(Continued)

OTHER PUBLICATIONS

Najeh Al-Salim, † Aidan G. Young,‡ Richard D. Tilley,§ A. James McQuillan,‡ and James Xia, Synthesis of CdSeS Nanocrystals in Coordinating and Noncoordinating Solvents: Solvent's Role in Evolution of the Optical and Structural Properties, Chem. Mater. 2007, 19, 5185-5193.*

(Continued)

*Primary Examiner* — Ha Tran T Nguyen
*Assistant Examiner* — Vongsavanh Sengdara
(74) *Attorney, Agent, or Firm* — Workman Nydegger (57) ABSTRACT

Semiconductor emitting devices that offset stresses applied to a quantum well region and reduce internal fields due to spontaneous and piezoelectric polarizations are disclosed. In one embodiment, a semiconductor emitting device includes a quantum well region comprising an active layer that emits light and at least one barrier layer disposed adjacent the active layer, a means for impressing an electric field across the quantum well region to inject carriers into the quantum well region, and a means for impressing an offset electric field across the quantum well region to offset the polarization field formed in the quantum well region.

14 Claims, 2 Drawing Sheets

U.S. PATENT DOCUMENTS

| | | | |
|---|---|---|---|
| 5,933,444 | A | 8/1999 | Molva et al. |
| 6,069,380 | A | 5/2000 | Chou et al. |
| 6,515,313 | B1 | 2/2003 | Ibbetson et al. |
| 6,627,914 | B1 | 9/2003 | Komiyama et al. |
| 6,798,552 | B2 * | 9/2004 | Tada ............................. 359/248 |
| 6,803,596 | B2 | 10/2004 | Hata |
| 6,813,063 | B2 | 11/2004 | Ishihara |
| 6,891,329 | B2 | 5/2005 | Nagano et al. |
| 7,420,225 | B1 * | 9/2008 | Wanke et al. ................. 257/192 |
| 7,638,817 | B2 | 12/2009 | Shur et al. |
| 2002/0031153 | A1 | 3/2002 | Niwa et al. |
| 2002/0150135 | A1 | 10/2002 | Naone et al. |
| 2004/0058467 | A1 | 3/2004 | Chirovsky et al. |
| 2004/0095978 | A1 | 5/2004 | Cheng et al. |
| 2004/0183087 | A1 | 9/2004 | Gardner |
| 2004/0232412 | A1 | 11/2004 | Burgener, II et al. |
| 2005/0074576 | A1 | 4/2005 | Chaiken et al. |
| 2005/0185686 | A1 | 8/2005 | Rupasov et al. |
| 2005/0285128 | A1 | 12/2005 | Scherer et al. |
| 2006/0244003 | A1 * | 11/2006 | Ueda et al. ..................... 257/103 |
| 2007/0063304 | A1 | 3/2007 | Matsumoto et al. |
| 2007/0126021 | A1 | 6/2007 | Ryu et al. |
| 2007/0126037 | A1 | 6/2007 | Ikeda |
| 2007/0194297 | A1 | 8/2007 | McCarthy et al. |
| 2007/0298551 | A1 | 12/2007 | Bouvet et al. |
| 2008/0048193 | A1 | 2/2008 | Yoo et al. |
| 2008/0197366 | A1 | 8/2008 | Yoo et al. |
| 2009/0017268 | A1 * | 1/2009 | Skipor et al. ................ 428/195.1 |
| 2009/0020149 | A1 | 1/2009 | Woods et al. |
| 2009/0114940 | A1 | 5/2009 | Yang et al. |
| 2009/0121628 | A1 | 5/2009 | Cho et al. |
| 2009/0273820 | A1 | 11/2009 | Dionne et al. |
| 2009/0310640 | A1 * | 12/2009 | Sato et al. ................ 372/45.011 |
| 2010/0096001 | A1 | 4/2010 | Sivananthan et al. |
| 2010/0155696 | A1 | 6/2010 | Duan et al. |
| 2010/0261338 | A1 | 10/2010 | Tsakalakos et al. |
| 2010/0276661 | A1 | 11/2010 | Ahn |
| 2010/0301308 | A1 | 12/2010 | Ahn |
| 2010/0301454 | A1 | 12/2010 | Zhang et al. |
| 2010/0326489 | A1 | 12/2010 | Ahn |
| 2011/0001122 | A1 | 1/2011 | Ahn |
| 2011/0001124 | A1 | 1/2011 | Ahn |
| 2011/0001125 | A1 | 1/2011 | Ahn |
| 2011/0043884 | A1 | 2/2011 | Ahn |
| 2011/0095309 | A1 | 4/2011 | Ahn |
| 2011/0114995 | A1 | 5/2011 | Ahn |
| 2012/0040483 | A1 | 2/2012 | Ahn |

FOREIGN PATENT DOCUMENTS

| | | |
|---|---|---|
| WO | WO 2009067347 | 5/2009 |
| WO | WO 2009106583 | 9/2009 |
| WO | WO2009106583 | 9/2009 |
| WO | WO 2010137865 | 12/2010 |
| WO | WO 2011004990 | 1/2011 |

OTHER PUBLICATIONS

Chul Huh, et al "Improvement in light-output efficiency of InGaN/GaN multiple-quantum well light-emitting diodes by current blocking layer" Journal of Applied Physics, vol. 92, No. 5, Sep. 1, 2002, pp. 2248-2250.

Seong-Ran Jeon, et al., "GaN tunnel junction as a current aperture in a blue surface-emitting light-emitting diode", Appl. Phys. Lett., vol. 80, No. 11, Mar. 18, 2002, 1933-1935, American Institute of Physics.

Hyunsoo Kim, et al., "Lateral current transport path, a model for GaN-based light-emitting diodes: application to practical device designs", Appl. Phys. Lett., vol. 81, No. 7, Aug. 12, 2002, 1326-1328, American Institute of Physics.

Seong-Ran Jeon, et al., "Lateral current spreading in GaN-based light-emitting diodes utilizing tunnel contact junctions", Appl. Phys. Lett., vol. 78, No. 21, May 21, 2001, 3265-3267, American Institute of Physics.

Doyeol Ahn "Time-convolutionless reduced-desnsity-operator theory of an arbitrary driven system coupled to a stochastic reservoir: Quantum kinetic equations for semiconductors" Physical Review B, vol. 50, No. 12, Sep. 15, 1994-II, pp. 8310-8318.

Doyeol Ahn "Time-convolutionless reduced-desnsity-operator theory of an arbitrary driven system coupled to a stochastic reservoir. II. Optical gain and line-shape function of a driven semiconductor" Physical Review B, vol. 51, No. 4, Jan. 15, 1995-II, pp. 2159-2166.

Seoung-Hwan Park, et al "Crystal-orientation effects on the piezoelectric field and electronic properties of strained wurtzite semiconductors" Physical Review B, vol. 59, No. 7, Feb. 15, 1999-I, pp. 4725-4737.

D. Ahn, et al "Electric field dependence of instrasubband polar-optical-phonon scattering in a quantum well" Physical Review B, vol. 37, No. 5, Feb. 15, 1988-I, pp. 2529-2535.

U.S. Appl. No. 12/489,228, mailed Jul. 12, 2011, Office Action.

U.S. Appl. No. 12/489,204, mailed Jul. 21, 2011, Notice of Allowance.

Siliconfareast.com; "Lattice Constants"; http://www.siliconfareast.com/lattice_constants.htm; 2 pages; retrieved Oct. 7, 2011.

Wikipedia; "Wurtzite crystal structure", http://en.wikipedia.org/wiki/Wurtzite_crystal_structure; 1 page; retrieved Oct. 7, 2011.

U.S. Appl. No. 12/472,168, mailed Aug. 18, 2011, Notice of Allowance.

U.S. Appl. No. 12/472,168, mailed Sep. 1, 2011, Notice of Allowance.

U.S. Appl. No. 12/498,204, mailed Jul. 28, 2011, Notice of Allowance.

U.S. Appl. No. 12/498,204, mailed Oct. 25, 2011, Notice of Allowance.

U.S. Appl. No. 12/498,265, mailed May 17, 2011, Office Action.

D. Ahn, et al "A field-effect quantum-well laser with lateral current injection" J. Appl. Phys. 64 (1), Jul. 1, 1988, pp. 440-442.

A. Jia, et al "Design of new UV/blue/green light emitters made of hexagonal-phase ZnMgCdOSSe mixed-crystal system fabricated on GaAs- and InP-(1 1 1) substrates" Journal of Crystal Growth 214/215 (2000) pp. 1085-1090.

Seoung-Hwan Park, et al "Many-body optical gain of wurtzite GaN-based quantum-well lasers and comparison with experiment" Appl. Phys. Lett. 72 (3), Jan. 19, 1998, pp. 287-289.

Seoung-Hwan Park, et al "Piezoelectric effects on electrical and optical properties of wurtzite GaN/AlGaN quantum well lasers" Applied Physics Letters vol. 72, No. 24, Jun. 15, 1998, pp. 3103-3105.

Seoung-Hwan Park, et al "Many-body optical gain and intraband relaxation time of wurtzite InGaN/GaN quantum-well lasers and comparison with experiment" Applied Physics Letters 87, 044103 (2005).

Seoung-Hwan Park, et al "Spontaneous and piezoelectric polarization effects in wurtzite ZnO/MgZnO quantum well lasers" Applied Physics Letters 87, 253509 (2005).

Seoung-Hwan Park, et al "Optical gain in InGaN/InGaAlN quantum well structures with zero internal field" Applied Physics Letters 92, 171115 (2008).

I.V. Bradley, et al "Space-charge effects in type-II strained layer superlattices" Journal of Crystal Growth 184/185 (1998), pp. 728-731.

Jie Liu, et al "AlGaN/GaN/InGaN/GaN DH-HEMTs With an InGaN Notch for Enhanced Carrier Confinement" IEEE Electron Device Letters, vol. 27, No. 1, Jan. 2006, pp. 10-12.

Doyeol Ahn "Theory of Non-Markovian Gain in Strained-Layer Quantum-Well Lasers with Many-Body Effects" IEEE Journal of Quantum Electronics, vol. 34, No. 2, Feb. 1998, pp. 344-352.

D. Ahn, et al "Optical Gain and Luminescence of a ZnO-MgZnO Quantum Well" IEEE Photonics Technology Letters, vol. 18, No. 2, Jan. 15, 2006, pp. 349-351.

Doyeol Ahn, et al "Non-Markovian Gain of Strained-Layer Wurtzite GaN Quantum-Well Lasers with Many-Body Effects" IEEE Journal of Selected Topics in Quantum Electronics, vol. 4, No. 3, May/Jun. 1998, pp. 520-526.

J. Ueno, et al "MBE growth of ZnSe/MgCdS and ZnCdS/MgCdS superlatttices for UV-A sensors" Phys. Stat. Sol. (c) 3, No. 4, (2006), pp. 1225-1228.

Yifei Zhang, et al "Charge control and mobility studies for an AiGan/GaN high electron mobility transistor" Journal of Applied Physics, vol. 85, No. 1, Jan. 1, 1999, pp. 587-594.

Tsung-Hsing Yu, et al "Theoretical study of the two-dimensional electron mobility in strained III-nitride heterostructures" Journal of Applied Physics, vol. 89, No. 7, Apr. 1, 2001, pp. 3827-3834.
Seoung-Hwan Park "Crystal Orientation Effects on Electronic Properties of Wurtzite GaN/AlGaN Quantum Wells with Spontaneous and Piezoelectric Polarization" Jpn. J. Appl. Phys. vol. 39 (2000), pp. 3478-3482.
P. Waltereit, et al "Nitride semiconductors free of electrostatic fields for efficient white light-emitting diodes" Letters to Nature, vol. 206, Aug. 24, 2000, pp. 865-868.
P.I. Kuznetsov, et al "Hexagonal ZnCdS epilayers and CdSSe/ZnCdS QW structures on CdS(0001) and ZnCdS (0001) substrates grown by MOVPE" Physica E 17 (2003), pp. 516-517.
Al-Salim, Najeh, Synthesis of CdSeS Nanocrystals in Coordinating and Noncoordinating Solvents: Solvent's Role in Evolution of the Optical and Structural Properties, Mar. 26, 2007.
B. Ullrich, Semiconductor Science and Technology "Green emission and bandgap narrowing due to two-photon excitation in thin film CdS formed by spray pyrolysis", published Jun. 22, 2011.
U.S. Appl. No. 12/606,880, mailed Aug. 15, 2011, Notice of Allowance.
U.S. Appl. No. 12/498,265, mailed Aug. 26, 2011, Office Action.
U.S. Appl. No. 12/498,204, mailed Apr. 26, 2011, Office Action.
U.S. Appl. No. 12/606,880, mailed Apr. 29, 2011, Office Action.
U.S. Appl. No. 12/606,880, filed Oct. 27, 2009, Ahn.
Arup Neogi, et al. "Enhancement of spontaneous recombination rate in a quantum well by resonant surface plasmon coupling" Physical Review B, vol. 66 (2002) pp. 153305-1-153305-4.
Australian Patent Office; International Search Report and Written Opinion in corresponding PCT application (PCT/KR2010/007292); mailed Jan. 26, 2011.
D-M. Yeh, et al "Surface plasmon coupling effect in an InGaN/GaN single-quantum-well light-emitting diode" Appl. Phys. Lett. 91, 171103 (2007).
E. H. Sargent, et al "Lateral Injection Lasers" International Journal of High Speed Electronics and Systems, Dec. 1998, vol. 9, No. 4, pp. 941-978.
Hetterich J., et al, Optimized Design of Plasmonic MSM Photodetector, IEEE Journal of Quantum Electronics Oct. 2007, vol. 43, No. 10, pp. 855 to 859.
K. Leosson, et al. "Long-range surface plasmon polariton nanowire waveguides for device applications" Optics Express, vol. 14, No. 1, Jan. 9, 2006 pp. 314-319.
Koichi Okamoto, et al. "Surface-plasmon-enhanced light emitters based on InGaN quantum wells" Nature Materials, vol. 3, Sep. 2004, pp. 601-605.
Liu Liu, et al. "Novel surface plasmon waveguide for high integration" Optics Express, vol. 13, No. 17, Aug. 22, 2005 pp. 6645-6650.
R. Paschotta "Encyclopedia of Laser Physics and Technology, vol. 1", Wiley-VCH, 2008, ISBN 3527408282, 9783527408283 p. 595.
S. Bai, al. et al "Determination of the electric field in 4H/3C/4H-SiC quantum wells due to spontaneous polarization in the 4H SiC matrix" Appl. Phys. Lett. 83, 3171 (2003).
Sergey I. Bozhevolnyi, et al. "Channel Plasmon-Polariton Guiding by Subwavelength Metal Grooves" Physical Review Letters, vol. 95, 046802, Jul. 22, 2005, pp. 046802-1-046802-4.
Sumith, B. et al., Quantum Well Infrared Photodetectors for Long Wavelength Infrared Applications Proceedings of SPIE, Oct. 1998, vol. 3436, Infrared Technology and Applications XXIV, pp. 280 to 284.
Taguchi, T., et al., Ultraviolet Laser and Photodetector of CdZnS/ZnS Multiple Quantum Wells, Physica B. 1993, vol. 191, pp. 136 to 139.
Yu, E.T., et al., Plasmonic Nanoparticle Scattering for Enhanced Performance of Photocoltaic and Photodetector Devices, Proceeding of SPIE, Aug. 28, 2008, vol. 7033, Plasmonics: Nanoimaging, Nanofabrication and their Application IV, pp. 70331V-1 to 70331V-9.
U.S. Appl. No. 12/472,168, mailed Jun. 18, 2010, Office Action.
U.S. Appl. No. 12/472,168, mailed Jul. 21, 2010, Office Action.
U.S. Appl. No. 12/472,168, mailed Jan. 5, 2011, Office Action.
U.S. Appl. No. 12/472,168, mailed Feb. 22, 2011, Notice of Allowance.
U.S. Appl. No. 12/498,228, mailed Sep. 1, 2010, Office Action.
U.S. Appl. No. 12/498,228, mailed Dec. 23, 2010, Office Action.
U.S. Appl. No. 13/485,241, filed May 31, 2012, Ahn.
U.S. Appl. No. 12/472,168, mailed May 29, 2012, Notice of Allowance.
U.S. Appl. No. 12/498,204, mailed May 29, 2012, Notice of Allowance.
U.S. Appl. No. 12/606,880, mailed May 23, 2012, Notice of Allowance.
Alda, Javier et al., "Optical antennas for nano-photonic applications," vol. 16, No. 5, Trends on Nanothecnology. TNT2004. Phantoms Foundations. Segovia (Spain). Sep. 13-17, 2004, http://www.iop.org/EJ/abstract/0957-4484/16/5/017.
Hoang, T. et al., "A high efficiency lateral light emitting device on SOI," Electron Devices for Microwave and Optoelectronic Applications, EDMO 2004, 12th International Symposium, Nov. 8-9, 2004, pp. 87-91.
LEDs Magazine, "Goldeneye sets brightness benchmark for green LEDs", http://www.ledsmagazine.com/news/5/5/18, May 15, 2008, 2 pages.
Smith S.J. et al., "Lateral light emitting n-i-p diodes in InSb/Alxln1—xSb quantum wells," Applied Physics Letters, vol. 89, p. 111118 (2006), 3 pages.
U.S. Appl. No. 12/472,168, mailed Mar. 29, 2012, Notice of Allowance.
U.S. Appl. No. 12/498,265, mailed Feb. 28, 2012, Office Action.
U.S. Appl. No. 12/498,228, mailed Dec. 15, 2011, Notice of Allowance.
U.S. Appl. No. 12/498,204, mailed Mar. 26, 2012, Notice of Allowance.
U.S. Appl. No. 12/498,204, mailed Feb. 1, 2012, Office Action.
U.S. Appl. No. 12/606,880, mailed Nov. 17, 2011, Notice of Allowance.
U.S. Appl. No. 12/606,880, mailed Feb. 16, 2012, Notice of Allowance.
"II-VI solar cells moving to the production phase," Photovoltaics Bulletin., (2003), vol. 2003, No. 11, Oct. 2003, pp. 10-12.
Andreani, Lucio Claudio, et al, Exchange interaction and polariton effects in quantum-well excitons, Physical Review B, vol. 41, No. 11, pp. 7536-7544 (1990).
Angelakis, D. G., et al., "Photon-blockade-induced Mott transitions and XY spin models in coupled cavity arrays," Phys. Rev. A76, 031805 (2007).
Chu, T.L., and Chu, S.S., "Thin film II-VI photovoltaics," vol. 38, Issue 3, Mar. 1995, pp. 533-549.
Compaan, A. D., et al., "Sputtered II-VI Alloys and Structures for Tandem PV," Subcontract Report NREL/SR-520-43954, Sep. 2008, pp. 64.
Gogolin, O., et al., Temperature dependence of exciton peak energies in Cui quantum dots, Solid State Communications, vol. 122, pp. 511-513 (2002).
Goosen, K.W., "Excitonic electroabsorption in extremely shallow quantum wells," Appl. Phys. Lett., vol. 57, Issue 24, pp. 2582-2584.
Greentree, A.D., et al., "Quantum phase transitions of light," Nature Physics 2, pp. 856-861 (2006).
Hartmann, M.J., and Plenio, M.B., "Strong Photon Nonlinearities and Photonic Mott Insulators," Physical Review Letters, vol. 99, Issue 10, Sep. 7, 2007, pp. 103601-1 to 103601-4.
Kawazoe, T., and Masumoto, Y., "Luminescence Hole Burning and Quantum Size Effects of Charged Excitons in CuCl Quantum Dots," Physical Review Letters, vol. 77, Issue 24, pp. 4942-4945 (1996).
Klimov, V.I., et al., "Optical Gain and Stimulated Emission in Nanocrystal Quantum Dots," Science, Oct. 13, 2000, vol. 290, No. 5490, pp. 314-317.
Little, R. B., et al., "Formation of quantum-dot quantum-well heteronanostructures with large lattice mismatch: ZnS/CdS/ZnS" Journal of Chemical Physics, vol. 114, No. 4, 2001, pp. 1813-1822.
Masumoto, Y., et al., "Observation of persistent spectral hole burning in CuBr quantum dots," Physical Review B, vol. 52, No. 7, pp. 4688-4691 (1995).
Obloh, H., "Group III-nitride based blue emitters," Advances in Solid State Physics, vol. 38, 15-28 (1999).
Park, S.-H., et al., "Internal field engineering in CdZnO/MgZnO quantum well structures," Applied Physics Letters, vol. 94, Issue:8, pp. 083507, 1-3 (2009).

Ricker, T., "Samsung's "world's smallest" 8.4 megapixel CMOS sensor: so long CCD?," accessed at http://www.engadget.com/2007/03/27/samsungs-worlds-smallest-8-4-megapixel-cmos-sensor-so-long/, Mar. 27, 2007, pp. 4.

Tassone, F., et al, "Quantum-well reflectivity and exciton-polariton dispersion," Physical Review B, vol. 45, No. 11, pp. 6023-6030 (1992).

Valenta, J., et al., "Hole-filling of persistent spectral holes in the excitonic absorption band of CuBr quantum dots," Applied Physics Letters, vol. 70, No. 6, pp. 680-682 (1997).

Williams, R.S., et al., "Growth and luminescence spectroscopy of a CuCl quantum well structure," Journal of Vacuum Science and Technology A: Vaccum, Surfaces and Films, vol. 6, No. 3, pp. 1950-1952 (1988).

Hernández, F. E. et al., "High Performance Optical Limiter," accessed at http://web.archive.org/web/20050429144449/http://www.ieee.org/organizations/pubs/newsletters/leos/dec00/high.htm, accessed on May 7, 2012, pp. 5.

Shakya, J., et al., "Switching characteristics of III-Nitride blue/green micro-LEDs," The Smithsonian/NASA Astrophysics Data System, American Physical Society, Annual March Meeting, Mar. 12-16, 2001.

S. X. Jin, et al., "Size dependence of III-nitride microdisk light-emitting diode characteristics," Applied Physics Letters, May 28, 2001, vol. 78, No. 22, pp. 3532-3534.

International Search Report and Written Opinion for International Application No. PCT/KR2010/002649 mailed on Jul. 26, 2010.

International Search Report and Written Opinion for International Application No. PCT/KR2010/005600 mailed on Oct. 22, 2010.

International Search Report and Written Opinion for International Application No. PCT/KR2010/008118 mailed on Feb. 11, 2011.

U.S. Appl. No. 12/472,168, mailed Oct. 1, 2012, Notice of Allowance.

U.S. Appl. No. 12/493,800, mailed Jan. 20, 2012, Office Action.

U.S. Appl. No. 12/493,800, mailed Apr. 26, 2012, Office Action.

U.S. Appl. No. 12/493,800, mailed Oct. 4, 2012, Notice of Allowance.

U.S. Appl. No. 12/498,265, mailed Aug. 17, 2012, Office Action.

U.S. Appl. No. 12/498,204, mailed Jul. 4, 2012, Issue Notification.

U.S. Appl. No. 12/545,678, mailed Dec. 16, 2011, Office Action.

U.S. Appl. No. 12/545,678, mailed Jun. 20, 2012, Notice of Allowance.

U.S. Appl. No. 12/545,678, mailed Oct. 2, 2012, Notice of Allowance.

U.S. Appl. No. 12/606,880, mailed Aug. 31, 2012, Notice of Allowance.

U.S. Appl. No. 12/606,880, mailed Oct. 3, 2012, Notice of Allowance.

U.S. Appl. No. 13/758,115, filed Feb. 4, 2013, Ahn.

U.S. Appl. No. 12/472,168, mailed Jan. 23, 2013, Issue Notification.

U.S. Appl. No. 12/493,800, mailed Jan. 16, 2013, Issue Notification.

U.S. Appl. No. 12/545,678, mailed Jan. 16, 2013, Issue Notification.

U.S. Appl. No. 12/606,880, mailed Jan. 16, 2013, Issue Notification.

U.S. Appl. No. 13/279,945, mailed Jan. 25, 2013, Notice of Allowance.

* cited by examiner

COMPOUND SEMICONDUCTORS

CROSS REFERENCE TO RELATED APPLICATION

This application is related to U.S. patent application Ser. No. 12/472,168 filed May 26, 2009, to U.S. patent application Ser. No. 12/498,265 filed Jul. 6, 2009, to U.S. patent application Ser. No. 12/498,204 filed Jul. 6, 2009, to U.S. patent application Ser. No. 12/498,228 filed Jul. 6, 2009, and to U.S. patent application Ser. No. 12/606,880 filed Oct. 27, 2009.

TECHNICAL FIELD

The described technology generally relates to semiconductor emitting devices and, more particularly, to semiconductor emitting devices with light emission efficiency.

BACKGROUND

A light-emitting diode (hereinafter, referred to as an LED) is an electronic light source based on a semiconductor diode. When the diode is forward biased (or switched on), electrons are able to recombine with holes, causing energy to be released in the form of light. This effect is known as electroluminescence and the color of light is determined by the energy gap of the semiconductor. Compared to traditional light sources, LEDs present numerous advantages including lower energy consumption, longer lifetime, improved reliability, vibration resistance and smaller size.

Recent advances in materials science have made possible the production of light emitting devices with very short wavelengths, thus producing light in a variety of colors. Conventional light emitting devices for short wavelengths are based on a vertical structure. In this vertical structure, electrons and holes are injected vertically and recombined at a light generating layer. Because both types of carriers are transported through several hetero junction layers, non-radiative recombination processes at each junction layer lowers the carrier injection rate and intrinsic quantum efficiency.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

In one embodiment, a semiconductor light emitting diode (hereinafter, also referred to as a "II-VI semiconductor LED") includes a quantum well region, $n^+$ and $p^+$ doping regions, and a gate that impresses an electric field across the quantum well region perpendicularly disposed to a plane of the quantum well region to offset polarization formed in the quantum well region. The quantum well region may include an active layer that emits light and at least one barrier layer disposed adjacent to the active layer, the active layer and the barrier layer including II-VI semiconductors. The $n^-$ and $p^+$ doping regions are spaced apart laterally and impress an electric field across the quantum well region to inject carriers laterally into the quantum well region.

The II-VI semiconductor LED may include compound semiconductors—the active layer and the barrier layer—including at least one element selected from the elements in Group II of the periodic table and at least one element selected from the elements in Group VI of the periodic table and is capable of emitting light in the red spectrum.

The term "compound semiconductor" as used herein refers to a semiconductor compound that includes elements from two or more different groups of the periodic table. The term "II-VI compound semiconductor" as used herein refers to a compound semiconductor that includes at least one element from Group II of the periodic table, and at least one element from Group VI of the periodic table. The II-VI compound semiconductor may include at least one element selected from a group other than Group II or Group VI of the periodic table. Also, the II-VI semiconductor may have a binary, a ternary, a quaternary or other structure.

The term "light in the red spectrum" (hereinafter, also referred to as "red light") as used herein refers to light having a wavelength ranging from about 585 nm to about 780 nm. The red light may also refer to light having a wavelength ranging from about 600 nm to about 700 nm, or light having a wavelength of about 660 nm.

The term "elements in Group II of the periodic table" (hereinafter, also referred to as "Group II elements") as used herein refers to elements belonging to Group IIa and Group IIb of the periodic table. The Group II elements include beryllium (Be), magnesium (Mg), calcium (Ca), strontium (Sr), barium (Ba), radium (Ra), zinc (Zn), cadmium (Cd) or mercury (Hg).

The term "elements in Group VI of the periodic table" (hereinafter, also referred to as "Group VI elements") as used herein refers to elements belonging to Group VIa and Group VIb of the periodic table. The Group VI elements may include oxygen (O), sulfur (S), selenium (Se), tellurium (Te) or polonium (Po).

In one embodiment, the II-VI semiconductor may include magnesium (Mg), zinc (Zn) or cadmium (Cd) from the Group II elements, and sulfur (S) or selenium (Se) from the Group VI elements. In another embodiment, the II-VI semiconductor may include zinc (Zn) or cadmium (Cd) from the Group II elements, and sulfur (S) or selenium (Se) from the Group VI elements. In still another embodiment, the II-VI semiconductor may include cadmium (Cd) from the Group II elements, and sulfur (S) or selenium (Se) from the Group VI elements. In yet another embodiment, the II-VI semiconductor may include CdS, CdSeS, MgSeS, ZnSeS, MgCdSeS, ZnCdSeS or MgZnSeS. In a further embodiment, the II-VI semiconductor may include a compound represented by formula 1 below:

$$CdSe_xS_{1-x} \qquad \text{formula [1]}$$

where x is 0.6 to 1.

The aforementioned compound represented by formula 1 may be an alloy of CdS and CdSe. Both of these compounds are direct band gap semiconductors and have a strong excitation binding energy and, therefore, when the compound represented by formula 1 is applied to various optical devices, the quantum efficiency of such optical devices can be improved.

In one embodiment, the II-VI semiconductor LED may have a low-symmetry structure to efficiently suppress the propagation of defects when the LED is applied to various optical devices. The types of low-symmetry structures are not particularly limited, and examples thereof may include a hexagonal structure (wurtzite structure). In the hexagonal structure, the lattice constant in a-axis may be in the range of about 2.5 Å to about 5.5 Å, about 3 Å to about 4.7 Å or about 4 Å to about 4.7 Å. In one embodiment, the lattice constant in a-axis may be about 4.13 Å, about 4.2 Å, about 4.3 Å, or about 4.7 Å.

Techniques for preparing the II-VI semiconductor LED are not particularly limited, and any of a variety of well-known techniques for forming compound semiconductors may be applied. Examples of suitable techniques include physical vapor deposition (PVD) techniques such as thermal evaporation, DC sputtering, RF sputtering, ion beam sputtering, pulsed laser deposition, metalorganic vapor phase epitaxy (MOVPE), hybrid vapor phase epitaxy (HVPE), liquid phase epitaxy (LPE), metalorganic molecular beam epitaxy (MOMBE), atomic layer deposition (ALD) or molecular beam epitaxy (MBE), or chemical vapor deposition (CVD) techniques such as thermal CVD, low pressure CVD, plasma enhanced CVD, or metal-organic CVD (MOCVD).

Also described is a semiconductor emitting device including a substrate, a buffer layer disposed above a surface of the substrate, a quantum well region arranged on the buffer layer, $n^+$ and $p^+$ doping regions that are spaced apart laterally and impress an electric field across the quantum well region to inject carriers laterally into the quantum well region, and a gate that impresses an electric field across the quantum well region perpendicularly to a plane of the quantum well region to offset polarization formed in the quantum well region. The quantum well region includes an active layer that emits light disposed between a first barrier layer and a second barrier layer, and the active layer and the barrier layers include II-VI semiconductors.

The semiconductor emitting device according to the various embodiments of the present disclosure may offset stresses applied to a quantum well region, and reduce the internal polarization field due to spontaneous and piezoelectric polarizations. The semiconductor emitting device according to the various embodiments of the present disclosure may include Group II-VI compounds and may exhibit improved light efficiency.

Hereinafter, various illustrative embodiments of semiconductor emitting devices are described. The figures used in describing the illustrative embodiments are provided for ease and convenience of explanation and the shapes of layers, electrodes and members in the figures may be exaggerated or abridged.

Figure 1:
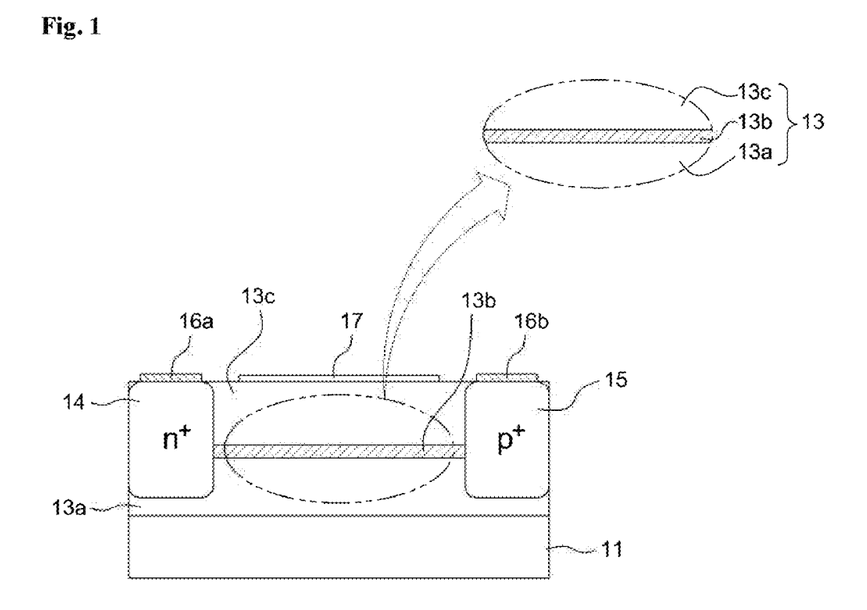
FIG. 1 shows a schematic of an illustrative embodiment of a semiconductor emitting device.

FIG. 1 shows a schematic of an illustrative embodiment of a semiconductor emitting device. As shown in FIG. 1, the semiconductor emitting device includes a substrate 11, a quantum well region 13, an $n^+$ doping region 14, a $p^+$ doping region 15, electrodes 16a, 16b, and a gate 17. The quantum well region 13 includes a first barrier layer 13a, an active layer 13b and a second barrier layer 13c.

The substrate 11 may be a doped n-type or p-type semiconductor substrate, or may be an un-doped semiconductor substrate. By way of example, and not limitation, sapphire, SiC, Si, ZrB, CrB, GaAs or the like may be used as the substrate 11. A GaAs compound with the orientation [111] or [001] may also be used as the substrate 11. By way of example, the substrate 11 may have a thickness of about 100 micrometers.

The quantum well region layer 13 may be developed on the substrate 11 by epitaxial growth techniques such as Molecular Beam Epitaxy (MBE) or Metal-organic Chemical Vapor Deposition (MOCVD). The quantum well region 13 may include at least one barrier layer and at least one active layer. As illustrated by the semiconductor emitting device of FIG. 1, the quantum well region 13 includes a single active layer 13b formed between the first barrier layer 13a and the second barrier layer 13c. The quantum well region 13 may also include multiple active layers having several alternating barrier layers. The quantum well region 13 may have a thickness ranging from about 50 nm to about 200 nm, from about 70 nm to about 150, or from about 90 nm to about 120 nm.

The electrodes 16a and 16b are formed on the $n^+$ doping region 14 and the $p^+$ doping region 15, respectively, to impress the electric field across the quantum well region 13 to inject carriers into the quantum well region 13. The barrier layers 13a and 13c generate carriers for light-emission from the electric field applied through the electrodes 16a and 16b, and the active layer 13b interposed between the first barrier layer 13a and the second barrier layer 13c emits light by recombining the carriers.

The active layer 13b, the first barrier layer 13a and the second barrier layer 13c constituting the quantum well region 13 are semiconductors that include a compound of Group II-VI elements. The active layer 13b may be a single crystal semiconductor compound of Group II-VI elements. The barrier layers 13a and 13c arranged over and under the active layer 13b, respectively, may be single crystal semiconductors including a ternary compound or a quaternary compound of Group II-VI elements. The energy band gap of the active layer 13b of selected Group II-VI semiconductors is smaller than the energy band gap of the barrier layers 13a and 13b of selected Group II-VI semiconductors.

In one embodiment, the active layer 13b may include CdSeS. The active layer 13b of CdSeS may be represented by $CdSe_xS_{1-x}$, where the cadmium (Cd), selenium (Se) and sulfur (S) compositions may be controlled so as to determine or control the wavelength of light emitted from the active layer 13b.

The selenium (Se) composition "x" and the sulfur (S) composition "1−x" is in the range of $[0.6 \leq x \leq 1.0]$ and $[\leq 1-x \leq 0.4]$. The band gap energy ($E_g$) of light emitted from the active layer 13b can be predicted by formula 2 below:

$$E_g = 2.482 - 0.75x (eV),\qquad\text{[formula 2]}$$

where x is 0.6 to 1.

For example, when the selenium (Se) composition "x" is 0.7, the band gap energy is 1.957 eV and the wavelength of light emitted from the active layer 13b is 633 nm. Therefore, when the selenium (Se) composition "x" is in the range of $[0.6 \leq x \leq 1.0]$, the color of light emitted from the active layer 13b is a red color.

In another embodiment, the barrier layers 13a and 13c may include II-VI semiconductor compounds such as ZnS or MgZnS. The compositions of the elements constituting the first barrier layer 13a and the second barrier layer 13c may be symmetrically controlled to reduce the stress applied to the active layer 13b.

The first and the second barrier layers 13a and 13c are semiconductor layers developed with an orientation inclined with respect to the axis [0001]. For example, the first and the second barrier layers 13a and 13c may be semiconductor layers developed with an orientation inclined toward the axis [1122] at an angle of about 40° to about 70° with respect to the axis [0001] on a [0001]-oriented substrate. Under the foregoing orientation, the semiconductor emitting device is capable of reducing piezoelectric fields and spontaneous polarization of the active layer 13b and increasing the light generation efficiency thereof by controlling the cadmium (Cd), the magnesium (Mg) and/or zinc (Zn) compositions.

In still another embodiment, the barrier layers 13a and 13c may include CdMgZnS, which may be represented by $Cd_kMg_jZn_{1-k-j}S$, where the cadmium (Cd), magnesium (Mg), zinc (Zn) and sulfur (S) compositions may be controlled. The barrier layers 13a and 13c including the quaternary compounds, $Cd_kMg_jZn_{1-k-j}S$, are able to minimize the spontaneous and piezoelectric polarization by appropriately varying k and j from 0 to 1.

After fabrication of the quantum well region 13, the $n^+$ doping region 14 and the $p^+$ doping region 15 may be formed respectively on the opposite lateral sides of the quantum well region 13 to laterally inject carriers therein, when forward biased. The $n^+$ doping region 14 and the $p^+$ doping region 15 may be formed by ion implantation of a suitable dopant species.

In one embodiment of the light emitting device, the electrodes 16a and 16b may be formed on the upper surface of the doping regions 14 and 15, respectively, and configured to apply an electric field thereto. When an electric field is applied to the doping regions 14 and 15 through the electrodes 16a and 16b, carriers may be laterally injected from the doping regions 14 and 15 to the quantum well region 13. The term "carrier" as used herein may mean an electron or a hole, which is recombined in the active layer to produce light corresponding to the band gap energy of the compound semiconductor. As described above, since the carriers are laterally injected into the active layer, the carriers do not need to travel through several hetero junction layers and, therefore, non-radiative recombination processes do not occur. As a result, the carrier injection rate and intrinsic quantum efficiency can be improved.

In one embodiment, the doping regions may have a depth ranging from about 2,000 Å to about 6,000 Å, from about 3,000 Å to about 5,000 Å, or from about 3,500 Å to about 4,500 Å. The n+ doping region 14 may be doped by many electrons and the p+ doping region 15 may be doped by many holes. The n+ doping region 14 and p+ doping region 15 are formed by injecting n-type impurities or p-type impurities. The n+ doping region 14 and the p+ doping region 15 are spaced apart laterally to impress the electric field across the quantum well region 13. The spacing between the doping regions is about 50 microns to 100 microns.

The electrodes 16a and 16b may include conductive electrodes. The conductive electrodes are formed on the top surface of a semiconductor emitting device to apply an electric field to the quantum well region 13 therethrough. The electrodes 16a and 16b may be formed from various materials. For example, the electrodes 16a and 16b may be formed from materials such as gold (Au) or may be formed with polymers such as poly silicon.

The electrodes 16a and 16b may be connected to an external power source (not shown). If the electrodes 16a and 16b are supplied with a voltage from the power source, an electric field may be applied to the semiconductor emitting device of FIG. 1. Based on the structure of the semiconductor emitting device, the active layer 13b converts electrical energy, which is derived from an electric field applied to the electrodes 16a and 16b, to light.

The gate 17 may be disposed on a top surface of the second barrier layer 13c. The gate 17 impresses an electric field across the quantum well region 13 substantially perpendicularly to the quantum well region 13 to offset polarization formed in the quantum well region 13. The gate 17 may be formed from various materials. For example, the gate 17 may be formed from metallic materials such as gold (Au) or poly silicon.

The gate 17 may be called by various names such as top gate, back gate, and so on, according to the installed location of the gate. The gate 17 may be called an offset gate because it is used to offset an internal electric field across the quantum well region 13. The internal electric field includes a spontaneous and piezoelectric polarization formed in the quantum well region 13.

The gate 17 may function in a manner similar to that of a gate for a conventional field effect transistor (FET), where a potential applied to the gate modulates the device operation.

Figure 2:
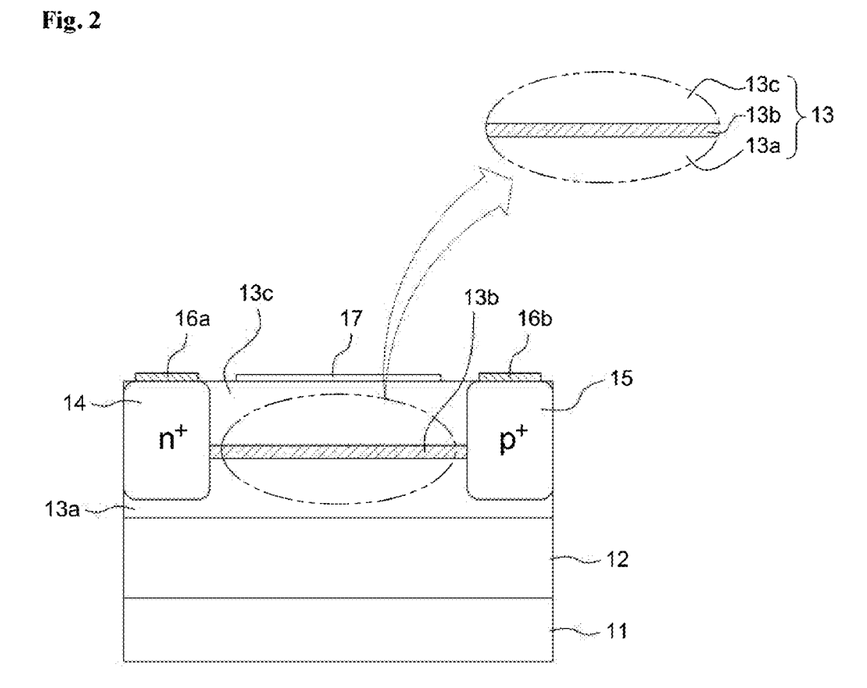
FIG. 2 shows a schematic of another illustrative embodiment of a semiconductor emitting device.

FIG. 2 shows a schematic of another illustrative embodiment of a semiconductor emitting device. As shown in FIG. 2, in addition to the components of the semiconductor emitting device described above in conjunction with FIG. 1, the semiconductor emitting device may further include a buffer layer 12 formed between the quantum well region 13 and the substrate 11. The buffer layer 12 reduces the stress caused by a lattice constant mismatch between the quantum well region 13 and the substrate 11.

The buffer layer 12 may include at least one element selected from the Group II elements and at least one element selected from the Group VI elements. For example, the buffer layer 12 may include II-VI semiconductor compounds such as ZnS, MgZnS or CdMgZnS. Except for the buffer layer 12, the other components of the semiconductor emitting device shown in FIG. 2 are substantially the same as the corresponding components of the semiconductor emitting device shown in FIG. 1. Accordingly, detailed descriptions of the similar components will not be duplicated.

Figure 3:
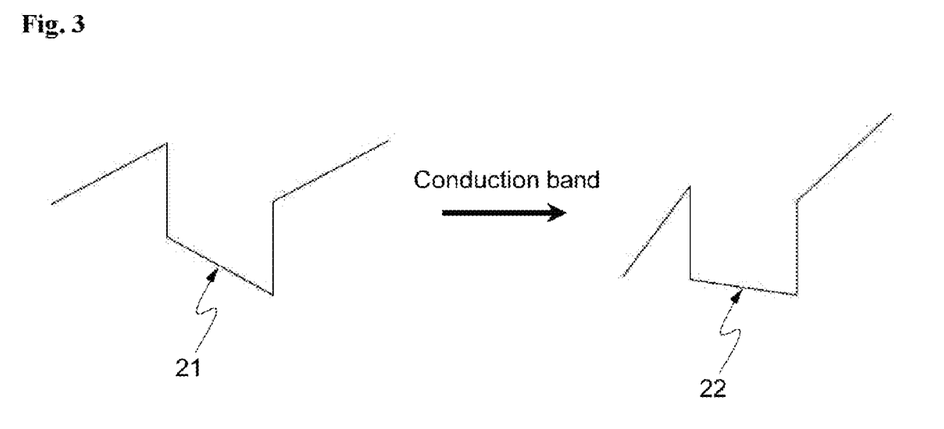
FIG. 3 shows an illustrative embodiment of a conduction band structure variation of a semiconductor emitting device.

FIG. 3 shows an illustrative embodiment of a conduction band structure variation of a semiconductor emitting device in accordance with an embodiment of the present disclosure. As shown on the left in FIG. 3, a conduction band structure 21 has an unbalanced structure when the electrodes 16a and 16b are turned on and the gate 17 is turned off. If the electrodes 16a and 16b impress an electric field in the quantum well region 13, then the carriers are injected into the quantum well region 13 and polarization develops in the quantum well region 13 due to the spontaneous and piezoelectric polarization.

The spontaneous and piezoelectric polarization is caused by the imbalance of the conduction band energy level. In order to increase quantum efficiency, the gate 17 may be used to offset the internal electric field including the spontaneous and piezoelectric polarization formed in the quantum well region 13.

As shown on the right in FIG. 3, a conduction band structure 22 changes to a balanced structure when the gate 17 impresses an electric field to offset the polarization in the quantum well region. When the conduction band energy level is balanced, the quantum efficiency of a semiconductor emitting device is improved.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

The disclosed semiconductor emitting devices may be applied to a variety of semiconductor devices and manufacturing processes without departing from the basic concept of the present disclosure. From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A semiconductor light emitting diode comprising:
   a substrate;
   a quantum well region disposed above a surface of the substrate, the quantum well region comprising an active layer operable to emit light and at least one barrier layer disposed adjacent to the active layer, the active layer and the barrier layer comprising II-VI semiconductors, wherein the at least one barrier layer has a composition and a crystal orientation at a selected angle relative to the substrate effective to reduce spontaneous electrical polarization in the quantum well region and effective to reduce piezoelectric fields that form in the quantum well region, the spontaneous electrical polarization and spontaneous piezoelectric fields forming an internal field across the quantum well region;
   $n^+$ and $p^+$ doping regions spaced apart laterally and operable to impress an electric field across the quantum well region to inject carriers laterally into the quantum well region; and
   a gate operable to impresses an offset electric field across the quantum well region perpendicularly to the plane of the quantum well region effective to substantially cancel the internal field formed in the quantum well region.

2. The semiconductor light emitting diode of claim 1, wherein the active layer comprises CdSeS, and the barrier layer comprises MgZnS.

3. The semiconductor light emitting diode of claim 1, wherein the active layer comprises CdSeS, and the barrier layer comprises ZnS.

4. The semiconductor light emitting diode of claim 1, wherein the active layer comprises CdSeS, and the barrier layer comprises CdMgZnS.

5. The semiconductor light emitting diode of claim 1, wherein the active layer comprises $CdSe_xS_{1-x}$ ($0.6 \leq x \leq 1.0$), and the barrier layer comprises MgZnS.

6. The semiconductor light emitting diode of claim 1, wherein the active layer comprises $CdSe_xS_{1-x}$ ($0.6 \leq x \leq 1.0$), and the barrier layer comprises ZnS.

7. The semiconductor light emitting diode of claim 1, wherein the active layer comprises $CdSe_xS_{1-x}$ ($0.6 \leq x \leq 1.0$), and the barrier layer comprises CdMgZnS.

8. A semiconductor emitting device comprising:
a substrate;
a buffer layer disposed above a surface of the substrate;
a quantum well region arranged on the buffer layer, the quantum well region comprising an active layer that emits light, the active layer disposed between a first barrier layer and a second barrier layer, the active layer and the first and second barrier layers comprising II-VI semiconductors, wherein the first and second barrier layers have a composition and a crystal orientation at a selected angle relative to the substrate effective to reduce spontaneous electrical polarization in the quantum well region and effective to reduce piezoelectric fields that form in the quantum well region, the spontaneous electrical polarization and spontaneous piezoelectric fields forming an internal field across the quantum well region;
$n^+$ and $p^+$ doping regions spaced apart laterally and operable to impress an electric field across the quantum well region to inject carriers laterally into the quantum well region; and
a gate operable to impresses an offset electric field across the quantum well region perpendicularly to the plane of the quantum well region to substantially cancel the internal field formed in the quantum well region.

9. The semiconductor emitting device of claim 8, wherein the active layer comprises CdSeS, and both the first barrier layer and the second barrier layer comprise MgZnS.

10. The semiconductor emitting device of claim 8, wherein the active layer comprises CdSeS, and both the first barrier layer and the second barrier layer comprise ZnS.

11. The semiconductor emitting device of claim 8, wherein the active layer comprises CdSeS, and both the first barrier layer and the second barrier layer comprise CdMgZnS.

12. The semiconductor emitting device of claim 8, wherein the active layer comprises $CdSe_xS_{1-x}$ ($0.6 \leq x \leq 1.0$), and both the first barrier layer and the second barrier layer comprise MgZnS.

13. The semiconductor emitting device of claim 8, wherein the active layer comprises $CdSe_xS_{1-x}$ ($0.6 \leq x \leq 1.0$), and both the first barrier layer and the second barrier layer comprise ZnS.

14. The semiconductor emitting device of claim 8, wherein the active layer comprises $CdSe_xS_{1-x}$ ($0.6 \leq x \leq 1.0$), and both the first barrier layer and the second barrier layer comprise CdMgZnS.

\* \* \* \* \*

UNITED STATES PATENT AND TRADEMARK OFFICE
CERTIFICATE OF CORRECTION

PATENT NO. : 8,395,141 B2
APPLICATION NO. : 12/498257
DATED : March 12, 2013
INVENTOR(S) : Ahn It is certified that error appears in the above-identified patent and that said Letters Patent is hereby corrected as shown below:

On the Title Page, Item (57), under "ABSTRACT", in Column 2, Line 6, delete "adjacent the active" and insert -- adjacent to the active --, therefor.

On Title Page 2, Item (56), under "OTHER PUBLICATIONS", in Column 1, Line 1, delete "et al" and insert -- et al., --, therefor at each occurrence throughout the Other Publications.

On Title Page 2, Item (56), under "OTHER PUBLICATIONS", in Column 1, Line 16, delete "desnsity" and insert -- density --, therefor.

On Title Page 2, Item (56), under "OTHER PUBLICATIONS", in Column 2, Line 1, delete "desnsity" and insert -- density --, therefor.

On Title Page 2, Item (56), under "OTHER PUBLICATIONS", in Column 2, Line 68, delete "superlatttices" and insert -- superlattices --, therefor.

On Title Page 3, Item (56), under "OTHER PUBLICATIONS", in Column 1, Line 64, delete "Photocoltaic" and insert -- Photovoltaic --, therefor.

On Title Page 3, Item (56), under "OTHER PUBLICATIONS", in Column 2, Lines 9-10, delete "Nanothecnology. TNT2004. Phantoms Foundations. Segovia Item (Spain)." and insert -- Nanotechnology, TNT2004, Phantoms Foundations, Segovia (Spain), --, therefor.

On Title Page 3, Item (56), under "OTHER PUBLICATIONS", in Column 2, Line 36, delete "et al," and insert -- et al., --, therefor at each occurrence throughout the Other Publications.

On Title Page 3, Item (56), under "OTHER PUBLICATIONS", in Column 2, Line 72, delete "Issue:8," and insert -- Issue: 8, --, therefor.

Signed and Sealed this
Eleventh Day of June, 2013

Teresa Stanek Rea
*Acting Director of the United States Patent and Trademark Office*

CERTIFICATE OF CORRECTION (continued)
U.S. Pat. No. 8,395,141 B2

On Title Page 4, Item (56), under "OTHER PUBLICATIONS", in Column 1, Line 13, delete "Vaccum," and insert -- Vacuum, --, therefor.

In the Drawings

In Fig. 2, Sheet 1 of 2, delete "DRAWINGS".

In the Specification

In Column 2, Line 10, delete "n⁻" and insert -- $n^+$ --, therefor.

In Column 4, Lines 47-48, delete "$[\leqq 1 - x \leqq 0.4].$" and insert -- $[0 \leq 1-x \leq 0.4].$ --, therefor.

In Column 5, Line 44, delete "n+" and insert -- $n^+$ --, therefor.

In Column 5, Line 45, delete "p+" and insert -- $p^+$ --, therefor.

In Column 5, Line 46, delete "n+ doping region 14 and p+" and insert -- $n^+$ doping region 14 and $p^+$ --, therefor.

In Column 5, Line 48, delete "n+ doping region 14 and the p+" and insert -- $n^+$ doping region 14 and the $p^+$ --, therefor.

In Column 8, Line 7, delete "thereof" and insert -- thereof. --, therefor.